(12) United States Patent
Yang et al.

(10) Patent No.: US 9,401,847 B2
(45) Date of Patent: *Jul. 26, 2016

(54) REGISTERING A COMMON INFORMATION MODEL PROVIDER TO A COMMON INFORMATION MODEL OBJECT MANAGER

(71) Applicant: International Business Machines Corporation, Armonk, NY (US)

(72) Inventors: Hui Yang, Shanghai (CN); Jun Wei Zhang, Shanghai (CN)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/692,013

(22) Filed: Apr. 21, 2015

(65) Prior Publication Data

US 2015/0229525 A1    Aug. 13, 2015

Related U.S. Application Data

(63) Continuation of application No. 13/472,543, filed on May 16, 2012, now Pat. No. 9,054,299, which is a continuation of application No. 12/429,748, filed on Apr. 24, 2009, now Pat. No. 8,214,472.

(30) Foreign Application Priority Data

May 26, 2008 (CN) .......................... 2008 1 0098403

(51) Int. Cl.
*G06F 15/173* (2006.01)
*H04L 12/24* (2006.01)
(Continued)

(52) U.S. Cl.
CPC ............ *H04L 41/0853* (2013.01); *H01L 41/12* (2013.01); *H04L 41/0206* (2013.01); *H04L 41/0213* (2013.01); *H04L 41/0233* (2013.01);
(Continued)

(58) Field of Classification Search
None
See application file for complete search history.

(56) References Cited

U.S. PATENT DOCUMENTS

| 5,894,479 A | 4/1999 | Mohammed |
| 6,832,371 B1 | 12/2004 | Hussey |
| 6,862,736 B2 | 3/2005 | Hudis et al. |

(Continued)

OTHER PUBLICATIONS

"Common Information Model (CIM) Infrastructure Specification", Distributed Management Task Force, Inc., DMTF, Version 2.3 Final, Oct. 4, 2005, 102 pages.

(Continued)

*Primary Examiner* — Joshua Joo
(74) *Attorney, Agent, or Firm* — Francis Lammes; Stephen J. Walder, Jr.; Randall J. Bluestone (57) ABSTRACT

A mechanism is provided for registering a Common Information Model (CIM) provider to at least one Common Information Model Object Manager (CIMOM). The CIMOM prestores at least one class definition. The CIMOM sends information to the Common Information Model (CIM) provider in order for the CIM provider to determine the at least one CIMOM existing in a network. The CIMOM sends the at least one class definition stored in the CIMOM in order for the CIM provider to determine if the CIMOM comprises a class definition suitable for the CIM provider to operate. Responsive to the CIM provider determining that the CIMOM comprises a suitable class definition, the CMOM registers the CIM provider by recording an identifier of the CIM provider under the name of the class definition suitable to the CIM provider in the at least one CIMOM.

18 Claims, 6 Drawing Sheets

(51) Int. Cl.
*H01L 41/12* (2006.01)
*H04L 29/08* (2006.01)

(52) U.S. Cl.
CPC ............ *H04L 41/12* (2013.01); *H04L 41/145* (2013.01); *H04L 67/16* (2013.01)

(56) References Cited

U.S. PATENT DOCUMENTS

| | | |
|---|---|---|
| 7,069,321 B1 | 6/2006 | Curtis et al. |
| 7,081,808 B2 | 7/2006 | Colombo et al. |
| 7,383,552 B2 | 6/2008 | Hudis et al. |
| 7,512,774 B2 | 3/2009 | Zarenin |
| 7,966,394 B1 | 6/2011 | Talwar et al. |
| 2002/0144009 A1 | 10/2002 | Cheng et al. |
| 2003/0135648 A1 | 7/2003 | Porter |
| 2003/0172088 A1 | 9/2003 | Mandal et al. |
| 2004/0153775 A1 | 8/2004 | Bhattacharjee et al. |
| 2004/0158838 A1 | 8/2004 | Tracey et al. |
| 2004/0249926 A1 | 12/2004 | Cheng et al. |
| 2005/0108725 A1 | 5/2005 | Hudis et al. |
| 2005/0193109 A1 | 9/2005 | Hudis et al. |
| 2005/0235071 A1 | 10/2005 | Zarenin |
| 2007/0073877 A1 | 3/2007 | Boykin et al. |
| 2007/0130235 A1 | 6/2007 | Rakoff et al. |
| 2008/0040376 A1 | 2/2008 | Reeves et al. |
| 2008/0066060 A1 | 3/2008 | Sonderegger |
| 2008/0104109 A1 | 5/2008 | Lenharth et al. |
| 2008/0126381 A1 | 5/2008 | Gatti et al. |
| 2008/0134197 A1 | 6/2008 | Dasari et al. |
| 2008/0222603 A1 | 9/2008 | Shaw et al. |
| 2008/0228909 A1 | 9/2008 | Hwang et al. |
| 2010/0050190 A1 | 2/2010 | Hiltgen et al. |

OTHER PUBLICATIONS

Cummings, Roger, "SNIA Technical Tutorial—Storage Network Management", Storage Networking Industry Association (SNIA), 2004, pp. 5-12, 21-49, 80-81, and 103-104.

Pilz, Andreas et al., "Network Management Information Models", Aeu-International Journal of Electronics and Communications 58.3 (2004), pp. 165-171.

Sundaram, Shanmugham et al., "Design and Implementation of WBEM-based Network Management System for Inter-AS Traffic Engineering", Fourth International Conference on Software Engineering Research, Management and Applications, Aug. 9-11, 2006, doi: 10.1109/SERA.2006.26, 8 pages.

REGISTERING A COMMON INFORMATION MODEL PROVIDER TO A COMMON INFORMATION MODEL OBJECT MANAGER

BACKGROUND

The present invention generally relates to the computer field. More particularly, the present invention relates to a method of registering a CIM provider to a CIMOM and corresponding apparatuses.

Common Information Model (CIM) is an industry standard model defined by Distributed Management Task Force (DMTF), which enables administrators or software management programs to control applications and devices on different platforms in the same way. Due to the generic architecture of CIM, it has been widely used in management software which manages various kinds of storage and network devices.

Figure 1:
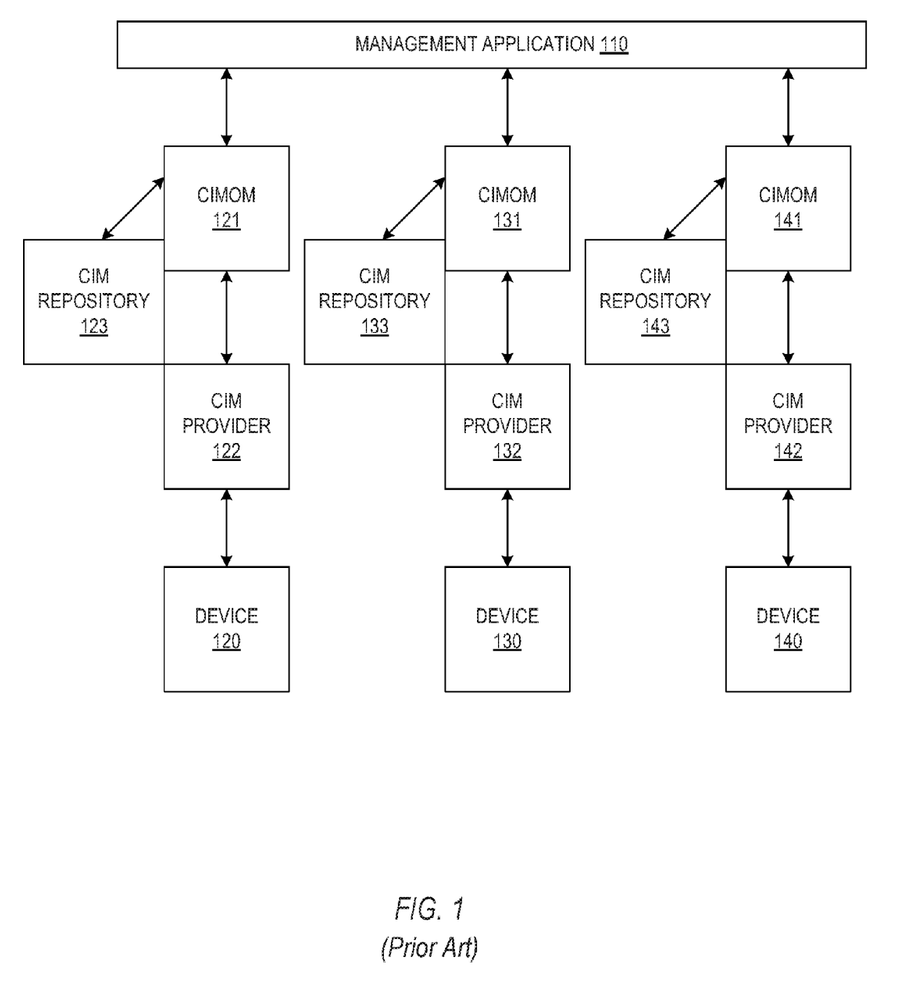
FIG. 1 shows a schematic view of the architecture of management software based on CIM standards in the prior art.

FIG. 1 shows a schematic view of the architecture of management software based on CIM standards in the prior art.

As shown in FIG. 1, management application 110 (also called CIM client) is connected to CIMOMs (CIM Object Manager) 121, 131 and 141, and CIMOMs 121, 131 and 141 are connected to devices 120, 130 and 140, respectively, via CIM providers 122, 132 and 142.

Additionally, CIMOMs 121, 131 and 141 can have CIM repositories 123, 133 and 143 respectively connected thereto.

Management application 110 sends a request for management information to CIMOMs 121, 131 and 141. Preferably, management application 110 communicates with CIMOMs 121, 131 and 141 using the Distributed Component Object Model (DCOM). Alternatively, management application 110 communicates with CIMOMs 121, 131 and 141 using the HyperMedia Management Protocol (HMMP). Of course, it can be understood by those skilled in the art that any protocol capable of passing object information between management application 110 and CIMOMs 121, 131 and 141 can be used.

Each of CIMOMs 121, 131 and 141 acts as a server (with respect to management application 110) and can switch roles so as to act on behalf of request of management application 110.

After management application 110 sends a request to CIMOMs 121, 131 and 141, CIMOMs 121, 131 and 141 first access their respective CIM repositories 123, 133 and 143 so as to determine whether they can satisfy the request directly or need to switch role from a server to a client and forward the request to CIM providers 122, 132 and 142, respectively.

For example, CIM repositories 123, 133 and 143 have static information stored therein, such as object property values. If what is requested by management application 110 to CIMOMs 121, 131 and 141 is static information, CIMOMs 121, 131 and 141 can satisfy the request directly without needing to forward the request to CIM providers 122, 132 and 142, respectively. Otherwise, CIMOMs 121, 131 and 141 transfer the request of management application 110 to CIM providers 122, 132 and 142, respectively.

Upon receipt of the request from CIMOMs 121, 131 and 141, CIM providers 122, 132 and 142 perform corresponding operation and provide corresponding result to CIMOMs 121, 131 and 141. By way of example, CIM providers 122, 132 and 142 are software drivers supplied by manufacturers of devices 120, 130 and 140.

Note that CIM providers 122, 132 and 142 hosted on the same machine as CIMOMs 121, 131 and 141 need not use DCOM or HMMP, but may instead use a private interprocess communication mechanism appropriate to the operating system.

According to the prior art, a user should manually register a CIM provider to a corresponding CIMOM before using the CIM provider. Where registering a CIM provider to a CIMOM includes providing the CIMOM with Managed Object Format (MOF) file that discloses CIM classes implemented by the CIM provider.

For multiple devices, even though they are of the same type, their CIM providers need to respectively register to a CIMOM. And in the CIMOM there will be multiple CIM classes used for respective CIM providers of the multiple same devices. That is to say, one CIM class is allowed to have only one CIM provider.

According to the prior art, it is impossible to register a CIM provider to a CIMOM without restarting the CIMOM to make the registration valid. Therefore, the management ability of the CIMOM cannot be extended.

Therefore, there is a need for a solution to overcome the defects outlined above.

SUMMARY

In one illustrative embodiment, a mechanism is provided for registering a Common Information Model (CIM) provider to at least one Common Information Model Object Manager (CIMOM). The illustrative embodiment pre-stores in the at least one CIMOM at least one class definition. The illustrative embodiment sends, by the at least one CIMOM, information and a response to a received Service Location Protocol (SLP) broadcast to the CIM provider in order for the CIM provider to determine the at least one CIMOM exists in a network. The illustrative embodiment sends, by the at least one CIMOM, the at least one class definition stored in the at least one CIMOM to the CIM provider in order for the CIM provider to determine whether the at least one CIMOM comprises a class definition valid for the CIM provider to operate. The illustrative embodiment registers, by the at least one CIMOM, the CIM provider by recording an identifier of the CIM provider under the name of the class definition valid to the CIM provider in the at least one CIMOM in response to the CIM provider determining that the at least one CIMOM comprises a valid class definition.

In another aspect of the invention, a computer program product comprising a computer useable or readable medium having a computer readable program is provided. The computer readable program, when executed on a computing device, causes the computing device to perform various ones, and combinations of, the operations outlined above with regard to the method illustrative embodiment.

These and other features and advantages of the present invention will be described in, or will become apparent to those of ordinary skill in the art in view of, the following detailed description of the example embodiments of the present invention.

BRIEF DESCRIPTION OF THE DRAWINGS

Other objects and effects of the present invention will become more apparent and easy to understand as the present invention is better understood and from the following description, taken in conjunction with the accompanying drawings wherein.

Like reference numerals designate the same, similar, or corresponding features or functions throughout the drawings.

DETAILED DESCRIPTION

Figure 2:
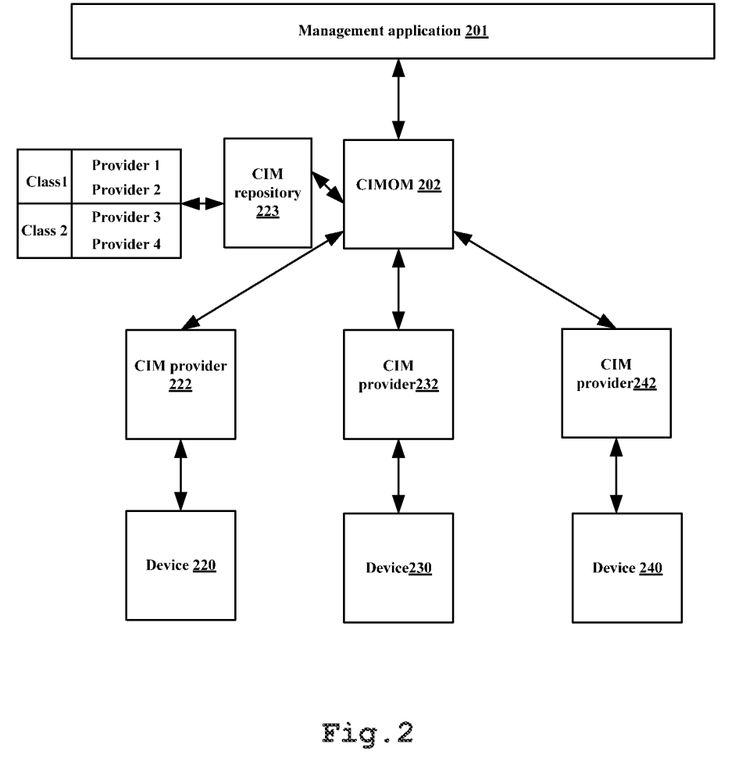
FIG. 2 shows a schematic view of the architecture of management software based on CIM standard according to an embodiment of the present invention.

FIG. 2 shows a schematic view of the architecture of management software based on CIM standards according to an embodiment of the present invention.

As shown in FIG. 2, management application 201 (also called CIM client) is connected to CIMOM 202, and CIMOM 202 is connected to devices 220, 230 and 240 via CIM providers 222, 232 and 242, respectively. Additionally, CIMOM 202 has a CIM repository 223 connected thereto.

That is to say, compared with FIG. 1, in FIG. 2, there is only one CIMOM that manages all CIM providers.

In the present invention, the CIM providers and the CIMOM can be installed on separate machines.

Moreover, in the present application, one CIM provider can register to multiple CIMOMs in the network. In this case, if one of CIMOMs crashes, the CIM provider that registers to multiple CIMOMs still can be accessed by a user via another CIMOM.

In the present invention, CIM providers 222, 232 and 242 are self-managed programs and can discover the existing CIMOMs in the network when plugged into the network.

When they discover a CIMOM, they will check whether they can register to the discovered CIMOM, i.e., check whether the discovered CIMOM has class definitions suitable to them.

When the CIM providers are compliant to the CIMOM, i.e., the CIMOM has class definitions suitable to the CIM providers, the CIM providers will register to the CIMOM.

Figure 3:
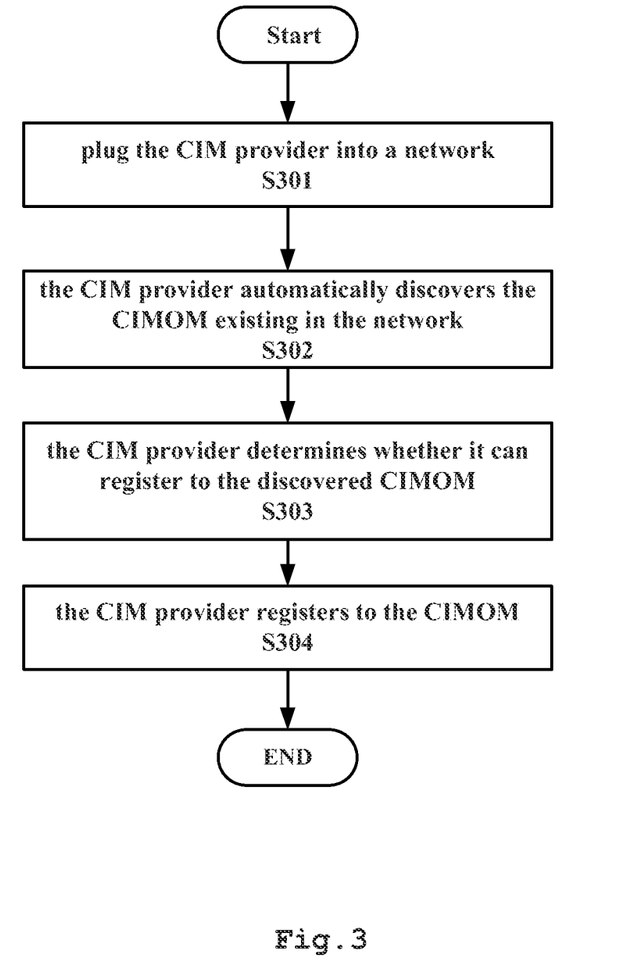
FIG. 3 shows an automatic registration procedure of a CIM provider according to an embodiment of the present invention.

FIG. 3 shows an automatic registration procedure of a CIM provider according to an embodiment of the present invention, which CIM provider is CIM provider 222 for example.

First, the CIM provider is plugged into the network in step S301.

Then, in step S302, the CIM provider automatically discovers the existing CIMOM in the network.

More specifically, this step can comprise:

sending by the CIM provider an SLP broadcast to the network; and receiving by the CIM provider a response to the SLP broadcast from the CIMOM.

Next, in step S303, the CIM provider determines whether it can register to the discovered CIMOM. For example, if the discovered CIMOM has a class definition suitable to the CIM provider, then the CIM provider determines that it can register to the CIMOM. If the discovered CIMOM does not have a class definition suitable to the CIM provider, then the CIM provider determines that it cannot register to the CIMOM.

Additionally, determining whether the CIM provider can register to the CIMOM can further comprise:

determining whether the CIM provider conforms to the CIMOM's requirements in the security aspect.

The class definition can include, without limitation, a property, a method, etc.

The security aspect includes, without limitation, whether the CIM provider is authorized to register to the CIMOM, whether the CIM provider carries virus code, etc.

If the CIM provider determines that it cannot register to the CIMOM, then the flow ends.

If the CIM provider determines that it can register to the CIMOM, then the flow goes to step S304.

In step S304, the CIM provider registers to the CIMOM.

The CIM provider registers to the CIMOM by recording itself under the name of the class suitable to it.

Then, the flow ends.

In the CIMOM, and more specifically, in CIM repository 223, there is a form that records CIM providers registered under each class, as shown in FIG. 2.

It can be understood by those skilled in the art if the CIM provider discovers multiple CIMOMs in step S302, then steps S303-S304 are performed for each of the discovered CIMOMs. Moreover, if the CIM provider does not discover one CIMOM in step S302, then steps S303-S304 will not be performed.

Specifically, the registration to the CIMOM mentioned here means recording the CIM provider under the name of the class suitable to it in the CIMOM. For example, the identifier Provider Unique ID capable of uniquely identifying one CIM provider can be recorded to a class-CIM provider table.

More specifically, assuming there are one CIMOM and two PC devices in the network and the CIM provider corresponding to each PC device has registered to the CIMOM. At this point, there are two CIM providers under the class CIM_ComputerSystem in the CIMOM.

After the third PC device to be added is connected to the network where the PC devices are located, the CIM provider of the newly added PC device will find the CIMOM in the network, check the compliance, and register itself to the CIMOM if the check is ok. Thus, there are three CIM providers under the class CIM_ComputerSystem in the CIMOM.

After the CIM provider has registered to the CIMOM, the management application can operate the device.

More specifically, assuming there are one CIMOM and three PC devices in the network and the CIM provider corresponding to each PC device has registered to the CIMOM. At this point, there are three CIM providers under the class CIM_ComputerSystem in the CIMOM.

The management application sends a request to the CIMOM for invoking the restart ( ) method on a certain PC device. At this point, the management application needs to specify the PC device.

Upon receipt of such a request, the CIMOM looks up the CIM provider corresponding to the PC device and accomplishes the restart operation on the PC device by invoking this CIM provider.

If the request sent to the CIMOM by the management application fails to specify a device but specifies a certain class, then the CIMOM will invoke all CIM providers under the name of this class.

Of course, the CIM provider can be deregistered from the CIMOM after registering to the CIMOM.

More specifically, assuming there are one CIMOM and three PC devices in the network and the CIM provider corresponding to each PC device has registered to the CIMOM. At this point, there are three CIM providers under the class CIM_ComputerSystem in the CIMOM.

The management application sends a request to the CIMOM for deregistering the CIM provider of a certain PC device. At this point, the management application needs to specify the PC device.

Upon receipt of such a request, the CIMOM deregisters the corresponding CIM provider according to the specified information. This procedure is implemented by simply cancelling the CIM provider from the name of the class suitable to it in the CIMOM, whereas this class still exists in the CIMOM because CIM providers of other two PC devices registers to the class.

The management application can no more operate, via the CIMOM, the PC device whose CIM provider was just deregistered.

Figure 4:
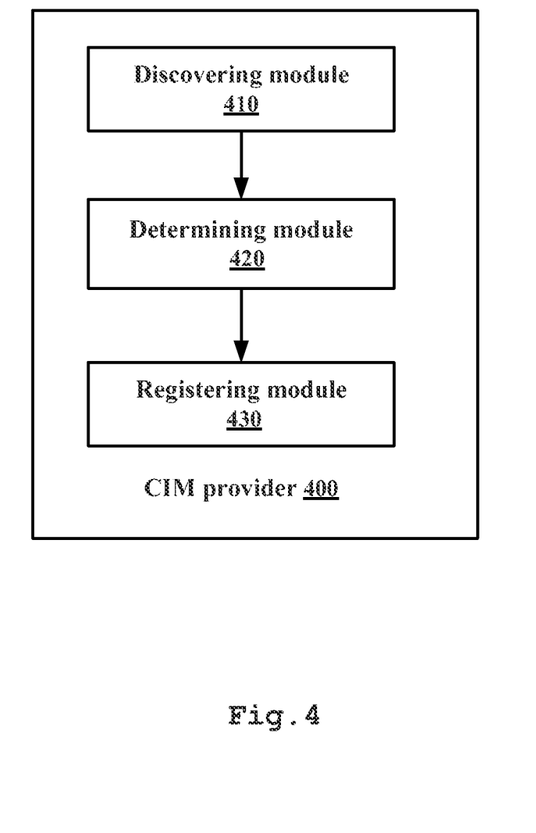
FIG. 4 shows a block diagram of a CIM provider 400 according to an embodiment of the present invention.

FIG. 4 shows a block diagram of a CIM provider 400 according to an embodiment of the present invention. CIM provider 400 is, for example, a CIM provider in FIG. 2.

CIM provider 400 comprises: a discovering module 410 for, when the CIM provider 400 is plugged into the network, discovering whether there is a CIMOM in the network; a determining module 420 for determining whether the CIM provider can register to the CIMOM, by determining whether the CIMOM discovered by the discovering module has a class definition suitable to the CIM provider pre-stored therein; and a registering module 430 for registering, by recording the CIM provider under the name of the class suitable to it in the CIMOM, the CIM provider to the CIMOM to which the CIM provider can register as determined by the determining module.

In an embodiment of the present invention, the determining module is further for determining whether the CIM provider can register to the CIMOM, by determining whether the CIM provider conforms to the CIMOM's requirements in the security aspect.

In an embodiment of the present invention, the discovering module discovers whether the CIMOM exists in the network by sending an SLP broadcast to the network and judging whether a response to the SLP broadcast is received from the CIMOM.

Figure 5:
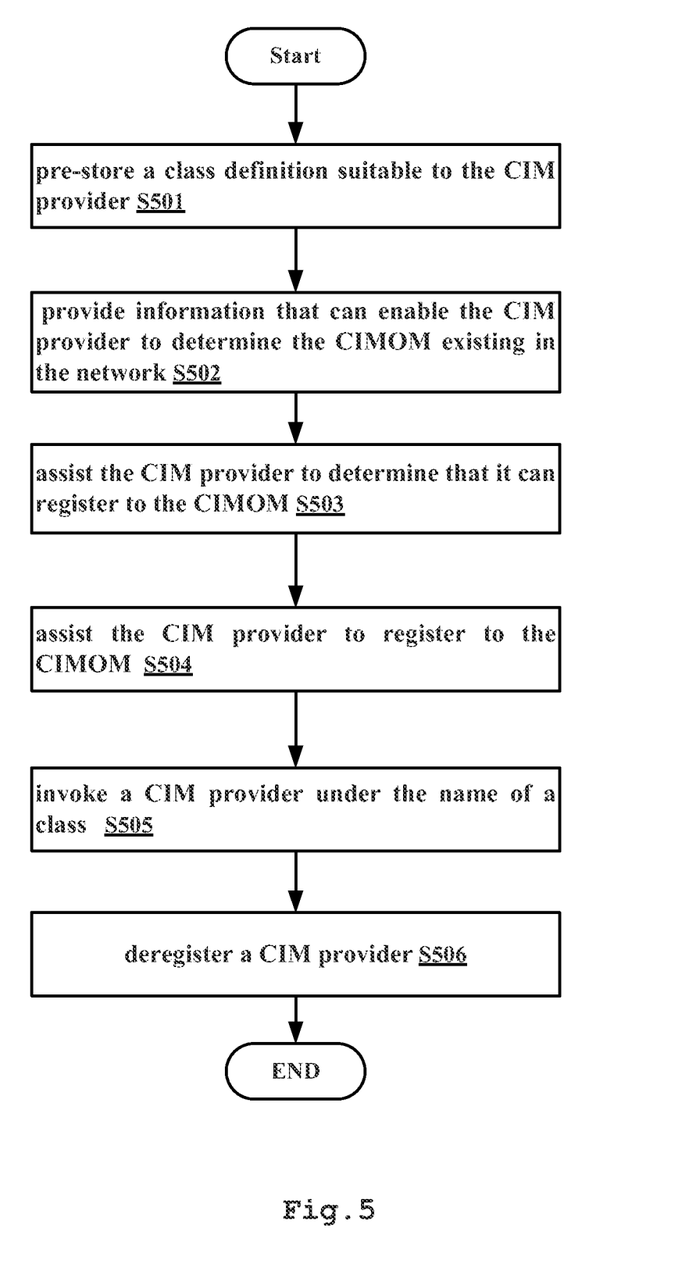
FIG. 5 shows steps performed by a CIMOM during/after the automatic registration procedure of a CIM provider according to an embodiment of the present invention.

FIG. 5 shows steps performed by the CIMOM during/after the automatic registration procedure of a CIM provider according to an embodiment of the present invention.

First, a class definition suitable to the CIM provider is pre-stored in the CIMOM in step S501.

Then, in step S502, the CIMOM sends to the CIM provider information that can enable the CIM provider to determine at least one CIMOM existing in the network.

In an embodiment of the present invention, information sent by the CIMOM to the CIM provider, which can enable the CIM provider to determine the CIMOM existing in the network, comprises a response, which is sent by the CIMOM to the CIM provider, to a received SLP broadcast.

Then, in step S503, the CIMOM assists the CIM provider to determine that the CIM provider can register to the CIMOM, by assisting the CIM provider to determine the CIMOM includes the class definition suitable to it.

For example, the CIMOM can provide information on the definition of classes pre-stored therein to the CIM provider according to the CIM provider's request.

In an embodiment of the present invention, the CIMOM assists the CIM provider to determine that the CIM provider can register to the CIMOM further comprises that the CIMOM assists the CIM provider to determine that the CIM provider conforms to the CIMOM's requirements in the security aspect.

Then, in step S504, the CIMOM assists the CIM provider to register to the CIMOM, wherein the CIM provider registers to the CIMOM by recording itself under the name of the class suitable to it in the CIMOM.

For example, the CIMOM can provide the CIM provider with a list of CIM providers that have registered to it, so as to prevent the CIM provider to register repeatedly.

Then, in step S505, after the CIMOM receives from the management application a request for invoking a CIM provider under the name of a class, it invokes the CIM provider under the name of the class.

Then, in step S506, after the CIMOM receives from the management application a request for deregistering the CIM provider, it deregisters the CIM provider by cancelling the CIM provider from the name of the class suitable to it.

Of course, it can be understood by those skilled in the art that step S505 may not take place. That is to say, the flow goes to step S506 from step S504.

Figure 6:
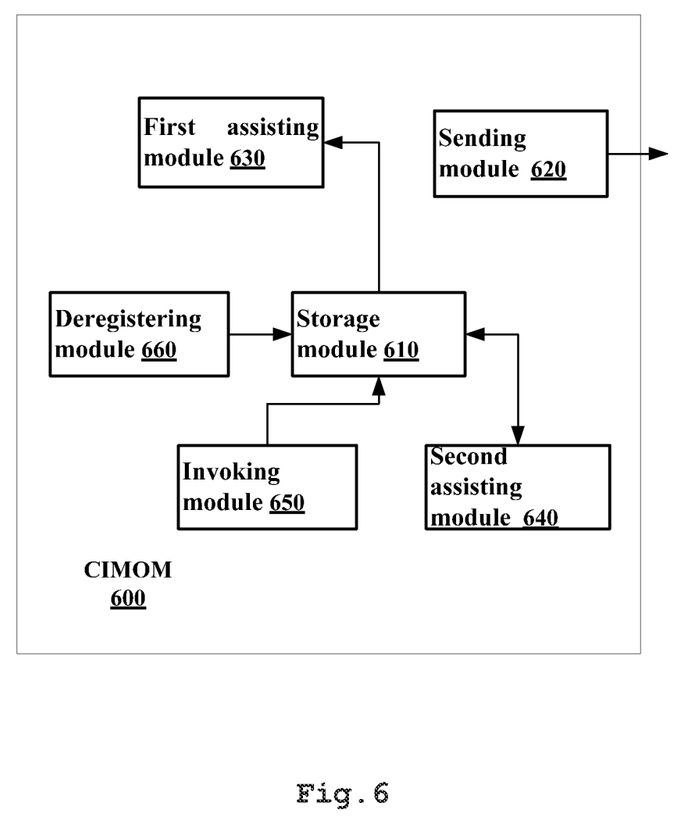
FIG. 6 shows a block diagram of a CIMOM 600 according to an embodiment of the present invention.

FIG. 6 shows a block diagram of a CIMOM 600 according to an embodiment of the present invention. CIMOM 600 is, for example, CIMOM 202 in FIG. 2.

As shown in FIG. 6, the CIMOM comprises: a storage module 610 for pre-storing in the CIMOM a class definition suitable to a CIM provider; a sending module 620 for sending to the CIM provider information that can enable the CIM provider to determine the CIMOM existing in the network; a first assisting module 630 for assisting the CIM provider to determine whether the CIM provider can register to the CIMOM, by assisting the CIM provider to determine whether the CIMOM has the class definition suitable to it; and a second assisting module 640 for assisting the CIM provider, which can register to the CIMOM as determined, to register to the CIMOM, wherein the CIM provider registers to the CIMOM by recording itself under the name of the class suitable to it in the CIMOM.

In an embodiment of the present invention, the first assisting module 630 is further for assisting the CIM provider to determine whether the CIM provider conforms to the CIMOM's requirements in the security aspect.

In an embodiment of the present invention, information that can enable the CIM provider to determine the CIMOM existing in the network includes a response of the CIMOM to a received SLP broadcast.

In an embodiment of the present invention, the CIMOM further comprises: an invoking module 650 for, upon receipt from the management application of a request for invoking a CIM provider under the name of a class, invoking the CIM provider under the name of the class; and a deregistering module 660 for deregistering the CIM provider by cancelling the CIM provider from the name of the class suitable to it in the CIMOM.

Note, in order to facilitate easier understanding of the present invention, the foregoing description omits more detailed technical details that are well known to those skilled in the art and might be indispensable to the implementation of the present invention.

The specification of the present invention has been presented for purposes of illustration and description, and is not intended to be exhaustive or to limit the invention in the form disclosed. Many modifications and variations will be apparent to those of ordinary skill in the art. It can be understood by those skilled in the art that the method and apparatus in the embodiments of the present invention can be implemented in software, hardware, firmware or a combination thereof. For example, the present invention can be implemented as a computer program product, which contains program code stored on a computer readable medium and carrying out the method described in the embodiments of the present invention when executed by a computer.

Therefore, the embodiments were chosen and described in order to better explain the principles of the invention, the practical application, and to enable others of ordinary skill in the art to understand that all modifications and alterations made without departing from the spirit of the present invention fall into the protection scope of the present invention as defined in the appended claims.

What is claimed is:

1. A method of registering a Common Information Model (CIM) provider to at least one Common Information Model Object Manager (CIMOM), comprising:
   pre-storing in the at least one CIMOM at least one class definition;
   sending, by the at least one CIMOM, information and a response to a received Service Location Protocol (SLP) broadcast to the CIM provider in order for the CIM provider to determine the at least one CIMOM exists in a network;
   sending, by the at least one CIMOM, the at least one class definition stored in the at least one CIMOM to the CIM provider in order for the CIM provider to determine whether the at least one CIMOM comprises a class definition valid for the CIM provider to operate; and
   responsive to the CIM provider determining that the at least one CIMOM comprises a valid class definition, registering, by the at least one CIMOM, the CIM provider by recording an identifier of the CIM provider under the name of the class definition valid to the CIM provider in the at least one CIMOM.

2. The method according to claim 1, further comprising:
   receiving, by the at least one CIMOM, a request for deregistering the CIM provider from a management application; and
   deregistering, by the at least one CIMOM, the CIM provider by cancelling the CIM provider from the name of the class valid to the CIM provider in the at least one CIMOM.

3. The method according to claim 1, further comprising:
   receiving, by the at least one CIMOM, a request for invoking the CIM provider under the name of a class from a management application; and
   invoking, by the at least one CIMOM, the CIM provider under the name of the class.

4. The method according to claim 1, further comprising:
   discovering, by the CIM provider that has been plugged into a network, the at least one CIMOM in the network;
   determining, by the CIM provider, whether the CIM provider can register with the at least one CIMOM, by determining whether the at least one CIMOM has a class definition valid to the CIM provider; and
   registering, by the CIM provider, with the at least one CIMOM by sending an identifier of the CIM provider to the at least one CIMOM for recording, by the at least one CIMOM, under the name of the class valid to the CIM provider.

5. The method according to claim 4, wherein determining, by the CIM provider, whether the CIM provider can register with the at least one CIMOM farther comprises:
   determining, by the CIM provider, that the CIM provider conforms to requirements of the at least one CIMOM in a security aspect.

6. The method according to claim 4, wherein discovering, by the CIM provider, the at least one CIMOM further comprises:
   sending, by the CIM provider, the SLP broadcast to the network;
   receiving, by the CIM provider, a response to the SLP broadcast from the at least one CIMOM.

7. An apparatus, comprising:
   a processor; and
   a memory coupled to the processor, wherein the memory comprises instructions which, when executed by the processor, cause the processor to:
   pre-store in at least one Common Information Model Object Manager (CIMOM) at least one class definition;
   send information and a response to a received Service Location Protocol (SLP) broadcast to a Common Information Model (CIM) provider in order for the CIM provider to determine the at least one CIMOM exists in a network;
   send the at least one class definition stored in the at least one CIMON to the CIM provider in order for the CIM provider to determine whether the at least one CIMOM comprises a class definition valid for the CIM provider to operate; and
   register the CIM provider by recording an identifier of the CIM provider under the name of the class definition valid to the CIM provider in the at least one CIMOM in response to the CIM provider determining that the at least one CIMOM comprises a valid class definition.

8. The apparatus according to claim 7, wherein the instructions further cause the processor to:
   deregister the CIM provider by cancelling the CIM provider from the name of the class valid to the CIM provider in the at least one CIMOM.

9. The apparatus according to claim 7, wherein the instructions further cause the processor to:
   upon receipt from a management application of a request for invoking the CIM provider under the name of a class, invoke the CIM provider under the name of the class.

10. The apparatus according to claim 7, wherein the instructions further cause the processor to:
    when the CIM provider is plugged into a network, discover the at least one CIMOM in the network;
    determine whether the CIM provider can register with the at least one CIMOM, by the CIM provider determining whether the at least one CIMOM has a class definition valid to the CIM provider; and
    register with the at least one CIMOM by sending an identifier of the CIM provider to the at least one CIMOM for recording, by the at least one CIMOM, under the name of the class valid to the CIM provider.

11. The apparatus according to claim 10, wherein the instructions further cause the processor to:
    determine whether the CIM provider can register to the at least one CIMOM, by determining whether the CIM provider conforms to requirements of the at least one CIMOM in a security aspect.

12. The apparatus according to claim 10, wherein the instructions further cause the processor to:
    discover whether the at least one CIMOM exists in the network by sending the SLP broadcast to the network and judging whether a response to the SLP broadcast is received from the at least one CIMOM.

13. A computer program product comprising a non-transitory computer-readable storage medium having a computer readable program recorded thereon, wherein the computer readable program, when executed on a computing device, causes the computing device to:
    pre-store in an at least one Common Information Model Object Manager (CIMOM) at least one class definition;
    send, by the at least one CIMOM, information and a response to a received Service Location Protocol (SLP) broadcast to a Common Information Model (CIM) provider in order for the CIM provider to determine the at least one CIMOM exists in a network;

send, by the at least one CIMOM, the at least one class definition stored in the at least one CIMOM in order for the CIM provider to determine whether the CIMOM comprises a class definition valid for the CIM provider to operate; and responsive to the CIM provider determining that the at least one CIMOM comprises a valid class definition, register, by the at least one CIMOM, the CIM provider by recording an identifier of the CIM provider under the name of the class definition valid to the CIM provider in the at least one CIMOM.

14. The computer program product according to claim 13, wherein the computer readable program further causes the computing device to:

receive, by the at least one CIMOM, a request for deregistering the CIM provider from a management application; and deregister, by the at least one CIMOM, the CIM provider by cancelling the CIM provider from the name of the class valid to the CIM provider in the at least one CIMOM.

15. The computer program product according to claim 13, wherein the computer readable program further causes the computing device to:

receive, by the at least one CIMOM, a request for invoking the CIM provider under the name of a class from a management application; and invoke, by the at least one CIMOM, the CIM provider under the name of the class.

16. The computer program product according to claim 13, wherein the computer readable program further causes the computing device to:

discover, by the CIM provider that has been plugged into a network, the at least one CIMOM in the network;

determine, by the CIM provider, whether the CIM provider can register with the at least one CIMOM, by determining whether the at least one CIMOM has a class definition valid to the CIM provider; and register, by the CIM provider, with the at least one CIMOM by sending an identifier of the CIM provider to the at least one CIMOM for recording, by the at least one CIMOM, under the name of the class valid to the CIM provider.

17. The computer program product according to claim 16, wherein the computer readable program to determine whether the CIM provider can register with the at least one CIMOM further causes the computing device to:

determine, by the CIM provider, that the CIM provider conforms to the at least one CIMOM's requirements in a security aspect.

18. The computer program product according to claim 16, wherein the computer readable program to discover the at least one CIMOM further causes the computing device to:

send, by the CIM provider, the SLP broadcast to the network;

receive, by the CIM provider, a response to the SLP broadcast from the at least one CIMOM.

* * * * *